(12) United States Patent
Pickerd (10) Patent No.: US 7,257,497 B2
(45) Date of Patent: Aug. 14, 2007

(54) SEQUENTIAL FREQUENCY BAND ACQUISITION APPARATUS FOR TEST AND MEASUREMENT INSTRUMENTS

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/349,782

(22) Filed: Feb. 7, 2006

(65) Prior Publication Data

US 2006/0247870 A1   Nov. 2, 2006

Related U.S. Application Data

(60) Provisional application No. 60/676,376, filed on Apr. 29, 2005.

(51) Int. Cl.
*H04L 25/00* (2006.01)

(52) U.S. Cl. .............................. 702/57; 702/75; 702/76; 702/126; 375/354; 341/155; 341/126; 370/343; 324/76.68

(58) Field of Classification Search ................. 702/57, 702/75, 76, 126; 370/481, 484, 343; 324/601, 324/74, 76.21, 76.78; 341/118, 120, 155; 375/316, 354; 455/226.04, 302
See application file for complete search history.

(56) References Cited

U.S. PATENT DOCUMENTS 4,054,785 A * 10/1977 Lehmann .................... 708/405
4,087,750 A * 5/1978 Allen et al. ................ 455/226.4
4,594,555 A * 6/1986 Hilton ......................... 329/305
5,659,546 A * 8/1997 Elder ........................... 370/343
5,668,836 A * 9/1997 Smith et al. .................. 375/316
5,920,187 A * 7/1999 Cosgrove et al. ............. 324/74
6,157,682 A * 12/2000 Oberhammer ............... 375/316
6,320,444 B1 * 11/2001 Shenoy et al. ............... 327/280
6,526,365 B1 * 2/2003 Marino et al. ............... 702/111
6,556,156 B1 * 4/2003 Hungerbuehler ............ 341/120
2003/0210755 A1 * 11/2003 Franca-Neto ................ 375/354

FOREIGN PATENT DOCUMENTS

WO   WO2004/038432 A2   5/2004

* cited by examiner

*Primary Examiner*—Carol S. W. Tsai
(74) *Attorney, Agent, or Firm*—Derek Meeker; Francis L. Gray; Thomas F. Lenihan (57) ABSTRACT

An acquisition apparatus for a test and measurement instrument includes an input to receive an input signal, a digitizer to digitize a selected signal, a bypass path to selectively couple the input to the digitizer, a frequency shift path to frequency shift the input signal and selectively couple the frequency-shifted input signal to the digitizer, the frequency shift path including a means for frequency shifting, an input switch to switch the input signal to one of the bypass path and the frequency shift path, and an output switch to provide the selected signal to the digitizer by selectively coupling an output of one of the frequency shift path and the bypass path to the digitizer.

11 Claims, 5 Drawing Sheets

SEQUENTIAL FREQUENCY BAND ACQUISITION APPARATUS FOR TEST AND MEASUREMENT INSTRUMENTS

CROSS-REFERENCE TO RELATED APPLICATIONS

This application claims priority under 35 U.S.C. § 119(e) from U.S. Provisional Application Ser. No. 60/676,376, filed on Apr. 29, 2005, the contents of which are herein incorporated by reference in their entirety.

FIELD OF THE INVENTION

This invention relates to test and measurement instruments and, more particularly, to a sequential frequency band acquisition apparatus for use in test and measurement instruments.

BACKGROUND

Digital oscilloscopes have limited input bandwidths. The bandwidth of an input signal is limited to the input bandwidth of the oscilloscope. In U.S. Patent Application Publication 2004/0128076 to Pupalaikis, et al., a real-time oscilloscope is disclosed with an increased usable bandwidth. The real-time oscilloscope splits the input signal into multiple split signals. One split signal is digitized. Simultaneously, the other split signals are frequency shifted to a baseband signal and digitized. The digitized frequency-shifted signals are frequency shifted to their original frequency range, and then combined with the other digitized signal to create a representation of the input signal. By frequency shifting frequency bands of the input signal to be within the bandwidth of their respective digitizers, an input signal having a frequency range larger than the input bandwidth of a digitizer may be acquired using the lower bandwidth digitizers.

However, this real-time oscilloscope requires that the input signal be split by a splitter and that the equivalent of an oscilloscope channel be used for each frequency band used in creating the representation of the input signal. As a result, the input signal may be degraded by the splitter, and the cost of such a single increased bandwidth oscilloscope channel increased to approximately the number of frequency bands times the cost of a normal channel.

Accordingly, a need remains for an improved acquisition apparatus for use in test and measurement instruments.

SUMMARY

An embodiment includes a sequential frequency band acquisition apparatus for a test and measurement instrument including an input to receive an input signal, a digitizer to digitize a selected signal, a bypass path to selectively couple the input to the digitizer, a frequency shift path to frequency shift the input signal and selectively couple the frequency-shifted input signal to the digitizer, the frequency shift path including a means for frequency shifting, an input switch to switch the input signal to one of the bypass path and the frequency shift path, and an output switch to provide the selected signal to the digitizer by selectively coupling an output of one of the frequency shift path and the bypass path to the digitizer.

Another embodiment includes a method of digitizing an input signal for a test and measurement instrument including digitizing the signal during an unshifted time period using a digitizer, frequency shifting the signal by at least one shift frequency, for each shift frequency, the frequency shifting occurring during an associated shifted time period, the associated shifted time period different from any other shifted time periods and the unshifted time period, digitizing each frequency-shifted signal during the associated shifted time period, and combining the digitized signal and each digitized frequency-shifted signal into a reconstructed signal.

A further embodiment includes a test and measurement instrument, such as a digital oscilloscope or a digitizer, including means for selecting a selected shift frequency from at least one shift frequency, means for shifting an input signal by the selected shift frequency, means for selecting the input signal or the frequency-shifted signal, means for digitizing the selected signal, means for storing the digitized version of each of the input signal and the signal frequency shifted by each shift frequency, and means for combining the stored signals into a reconstructed signal.

The foregoing and other objects, features, and advantages of the invention will become more readily apparent from the following detailed description of preferred embodiments which proceed with reference to the accompanying drawings.

DETAILED DESCRIPTION

Figure 1:
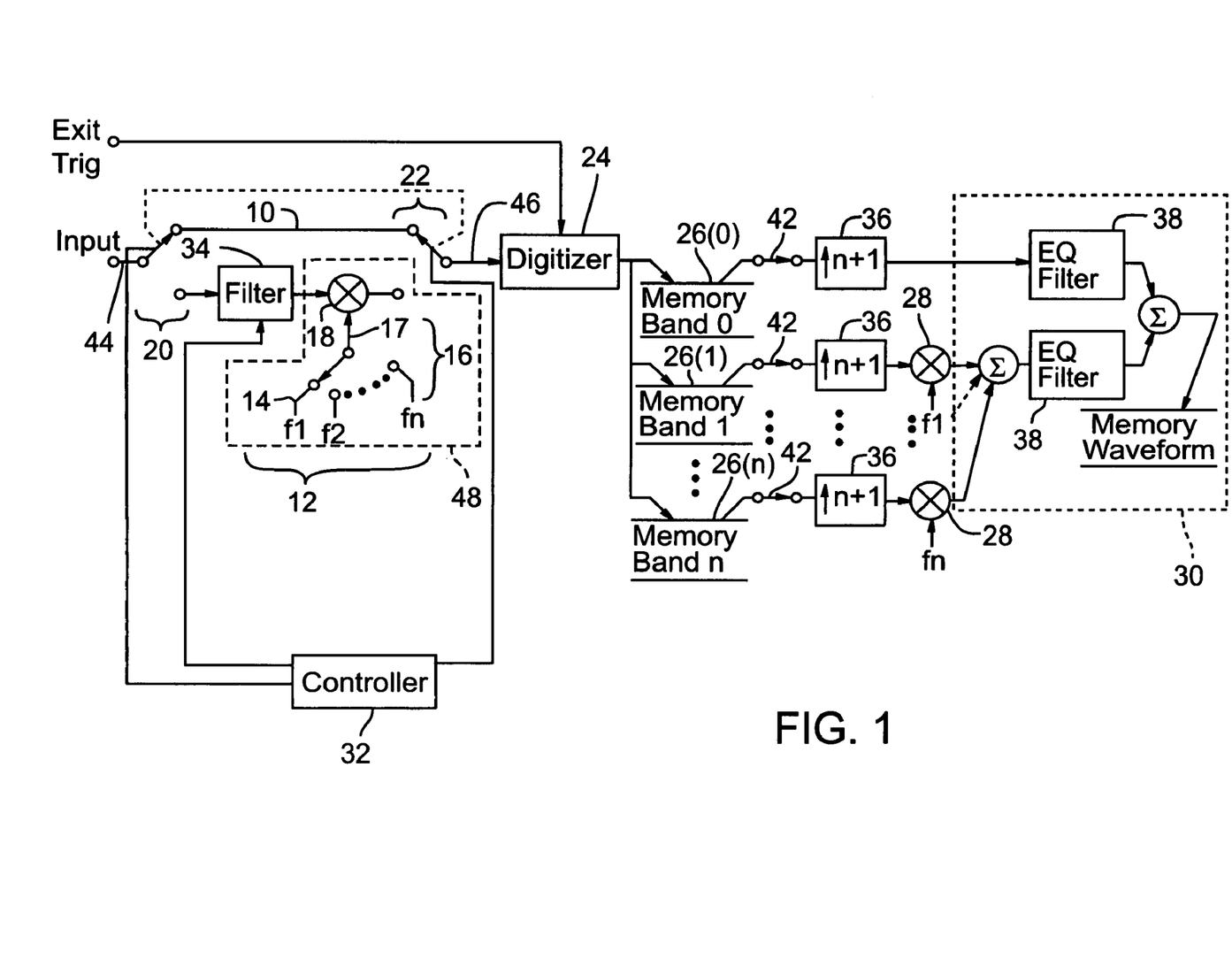
FIG. 1 is a block diagram of an embodiment of a sequential frequency band acquisition apparatus according to the invention.

FIG. 1 is a block diagram of an embodiment of a sequential frequency band acquisition apparatus according to the invention. The acquisition apparatus includes an input 44, a digitizer 24, a bypass path 10, a frequency shift path 12, an input switch 20, and an output switch 22. The input 44 receives an input signal. The digitizer 24 digitizes a selected signal 46.

Using switches 20 and 22, the bypass path 10 may selectively couple either the input 44 or a frequency-shifted version of the input 44 to the digitizer 24. For example, the bypass path 10 may directly couple the input signal 44 from the input switch 20 to the output switch 22 and the digitizer 24. When the input switch 20 has selected the bypass path 10, the input signal 44 passes through the input switch 20 to the bypass path 10. When the output switch 22 has selected the bypass path 10, a signal on the bypass path 10 passes through the output switch 22 to the digitizer 24 as the selected signal 46. For example, by leaving the input switch 20 and the output switch 22 coupled to the bypass path 10, the acquisition apparatus may behave as a normal acquisition apparatus without any frequency shifting of signals.

The frequency shift path 12 frequency shifts a signal coupled to it. The input switch 20 may couple the input signal 44 to the frequency shift path 12. The output switch 22 may couple a frequency-shifted signal to the digitizer 24 as the selected signal 46. The frequency shift path 12 includes a means for frequency shifting 48.

Although illustrated discretely in FIG. 1, the input switch 20 and the output switch 22 may be part of the same device. For example, the input switch 20 and the output switch 22 may be part of a double pole double throw (DPDT) switch.

The means for frequency shifting 48 shifts the frequency components of a signal coupled to the frequency shift path 12 to a lower frequency range. By shifting the frequencies of the signals to a lower frequency range, frequencies that would otherwise be outside of the bandwidth of the digitizer 24 are shifted to be within the bandwidth of the digitizer 24. For example, a digitizer 24 may have a bandwidth of 10 GHz. An input signal may have frequency components between 0 and 15 GHz. By frequency shifting the frequency components of the input signal between 10 and 15 GHz to within the 10 GHz bandwidth of the digitizer 24, the digitizer 24 may digitize the higher frequency components without excess distortion.

The means for frequency shifting 48 may include at least one frequency shifting signal 14, a signal selector 16 to select one of the at least one frequency shifting signal 14, and a frequency shifter 18 to frequency shift the input signal in response to the selected frequency shifting signal 17. The frequency shifting signal 14 may be a sinusoidal signal. There may be any number of frequency shifting signals 14 as illustrated in FIG. 1 by frequency shifting signals 14 f1 through fn. The signal selector 16 selects one of the frequency shifting signals 14 as the selected frequency shifting signal 17. The frequency shifter 18 shifts the frequency of the signal on the frequency shift path 12 in response to the selected frequency shifting signal 17.

For example, the frequency shifting signals 14 may be sinusoidal signals at frequencies f1, f2, and f3. The signal selector 16 may be an RF switch with the frequencies f1, f2, and f3 as inputs. One of the sinusoidal signals is selected by the RF switch to be passed through as the selected frequency shifting signal 17. The frequency shifter 18 may be a mixer. The selected frequency shifting signal 17 may be used as the local oscillator (LO) signal for the mixer. The signal input to the frequency shift path 12 may be used as the RF signal for the mixer. As a result, the signal on the frequency shifting path 12 will be shifted downward in frequency by the frequency of the selected frequency shifting signal 17.

The frequency shifting path 12 may also include a filter 34. The filter 34 may have multiple selectable cutoff frequencies. Each cutoff frequency is associated with one of the frequency shifting signals 14.

Although the filter 34 may not be required with some frequency shifters 18, a filter 34 may be used with a mixer as the frequency shifter 18. When mixing a signal with multiple frequency components near the LO frequency, two frequencies on opposite sides of the LO frequency may contribute to one baseband frequency. For example, a first frequency that is $\Delta f$ lower than the LO frequency and a second frequency that is $\Delta f$ higher than the LO frequency are both shifted to a frequency of $\Delta f$. As a result, the frequencies higher and lower than the LO frequency interfere with each other. To shift only the frequencies lower than the LO frequency, a filter 34 may be used to filter out the frequencies higher than the LO frequency. Similarly, a filter 34 may be used to filter out the frequencies lower than the LO frequency to shift the higher frequencies.

In one example, the RF port of the mixer may have a bandwidth that is 10% wider then the final desired extended bandwidth of the analog channel after multi-band signal reconstruction. For example, if the input signal has a range of 0 to 20 GHz, and the digitizer 24 has a bandwidth of 0 to 10 GHz, the mixer RF port may have a bandwidth from 0 to 22 GHz. Although one parameter for selecting a mixer has been described, one of ordinary skill in the art will understand that the RF bandwidth of the mixer may be selected to sufficiently cover the desired range of frequencies to be shifted. Such a bandwidth may be larger or smaller than 10% wider than the final desired extended bandwidth, depending on the characteristics of the mixer. For example, with a mixer having low amplitude and phase distortion at the edges of its RF band, the RF bandwidth may be selected to have less than the above-described 10% margin.

Furthermore, the RF bandwidth need not extend to DC. For example, with the above described 0 to 20 GHz input signal and 0 to 10 GHz digitizer bandwidth, a mixer with an RF bandwidth of 9 to 22 GHz and an IF bandwidth of 0 to 11 GHz may be used to frequency shift the frequency components of the input signal from 10 to 20 GHz to within the digitizer bandwidth.

One of ordinary skill in the art will understand that when using a mixer to frequency shift a given frequency band, several shifting frequencies may be used. For example, if a frequency band from 10 to 15 GHz is to be shifted, an LO frequency of 10 GHz may be used. As a result, frequencies around 10 GHz will be shifted to 0 GHz and frequencies around 15 GHz will be shifted to 5 GHz. Alternatively, an LO frequency of 15 GHz may be used. In this case, frequencies around 15 GHz will be shifted to 0 GHz and frequencies around 10 GHz will be shifted to 5 GHz. Thus, the frequencies between 10 and 15 GHz will be shifted to frequencies between 5 and 0 GHz, a mirror of the original frequencies in the frequency domain. Furthermore, a LO frequency outside of the desired frequency band may be used. Using the example signal of 10 to 15 GHz, an LO frequency of 9 GHz may be used. As a result, the frequencies will be shifted to 1 to 6 GHz. Any shifting frequency may be used that shifts the desired band to within the bandwidth of the digitizer 24.

The means for frequency shifting may include other circuits capable of shifting the frequency of a signal. For example, circuitry implementing other modulation techniques such as in-phase quadrature-phase (IQ) modulation may frequency shift signals.

One of ordinary skill in the art will understand that the signal selector 16 may take many forms. For example, the signal selector 16 may be a mechanical device that mechanically selects one of the frequency shifting signals 14. Alternatively, the signal selector 16 may be a solid state device that electronically selects one of the frequency shifting signals 14.

The digitizer 24 digitizes the selected signal 46. The digitizer 24 contains standard circuitry such as track and hold circuits and A/D converters needed to sample the waveform and store it in digital memory. The digitizer 24 may include an analog preamplifier. The preamplifier and any associated attenuators may form part of the analog channel of the digitizer 24. The digitizer 24 and the components shaping the input all contribute to the bandwidth of the digitizer 24. In addition, the bandwidth of the digitizer 24 may be much less than the final bandwidth of the reconstructed final waveform.

The acquisition apparatus may also include multiple memories 26(0) to 26(n) to store digitized signals from the bypass path 10 and from the frequency shift path 12. A memory 26(0) may be associated with the bypass path 10 and other memories 26(1) to 26(n) may be associated with the frequency shift path 12, with one memory of memories 26(1) to 26(n) for each selected frequency shifting signal 14.

The acquisition apparatus may also include digital frequency shifters 28 to frequency shift an associated signal from the frequency-shifted path 12 in an associated memory 26(1) to 26(n). Signals that were frequency shifted down in frequency are frequency shifted up to their original frequency. With the bandwidth of the digitizer as the bottleneck, a signal that has a frequency range exceeding the bandwidth of the digitizer may be accurately digitized by shifting the frequencies of the input signal that are out of the bandwidth of the digitizer down in frequency, digitizing these signals, then frequency shifting the frequency-shifted signals back to their original frequencies.

The acquisition apparatus may also include a combiner 30 to combine any signals from the frequency shift path 12 and the signal from the bypass path 10. With the signal from the bypass path 10 representing the signal that passes unshifted through the bandwidth of the digitizer 24, and the signals from the frequency shift path 12 representing the signals outside of the bandwidth of the digitizer 24, an accurate representation may be obtained of the input signal including frequencies outside of the bandwidth of the digitizer 24.

The acquisition apparatus may also include interpolators 36. Each interpolator 36 is configured to interpolate the signals in the memories 26 to a common sample rate. The common sample rate may be higher than the sample rate of the digitizer 24. For example, signals digitized by the digitizer 24 are sampled at the sample rate of the digitizer 24. The sample rate of the digitizer 24 may be adequate for representing a signal within the bandwidth of the digitizer 24. However, the sample rate may not be adequate to represent a signal outside of the bandwidth of the digitizer 24. Any signals that follow the frequency shift path 12 may originally include frequencies outside of the bandwidth of the digitizer 24. When frequency shifted, the signals from the frequency shift path 12 are able to pass through the bandwidth of the digitizer 24. However, since the sample rate of the digitizer may only be adequate for signals within the bandwidth of the digitizer 24, a sample rate higher than that of the digitizer may be needed to accurately represent signals from the frequency shift path 12 after they are shifted back to their original frequencies. By interpolating the digitized signals to a higher common sample rate, the combination of the digitized signals is a more accurate representation of the input signal.

The acquisition apparatus may also include an equalizing filter 38. The equalizing filter 38 is configured to equalize frequency responses from an input of the input switch 20, through the bypass path 10 or the frequency shift path 12 to an input of the equalizing filter 38 for each frequency shifting signal 14. As shown in FIG. 1, the equalizing filter 38 equalizes the combined frequency-shifted signals and another equalizer 38 equalizes the signal from the bypass path 10. The equalization may compensate for any magnitude or phase distortion due to using non-ideal components in the path leading up to the equalizer 38. The magnitude and phase equalization may also correct the time alignment between the digitized signals.

Although equalizing filters 38 have been shown both in a single path, and after a combination of multiple paths, one of ordinary skill in the art will understand that such equalizing filters may be located anywhere along the path of the input signal. For example, one equalizing filter 38 may be used after all of the signals are combined. Alternatively, each digitized signal may have an associated equalizing filter 38.

The acquisition apparatus may include band reject switches 42. Each band reject switch 42 is configured to decouple an associated memory 26 from a path to the combiner 30. Although band reject switches 42 have been illustrated as being implemented directly after the associated memories 26, the band reject switches may be implemented wherever they may decouple a memory 26 from the combiner 30. For example, the band reject switches 42 may be implemented after any interpolators 36. Furthermore, although the term switch has been used, a band reject switch 42 may be implemented as a physical element or as a digital element. For example, a band reject switch 42 may be a digital gain stage with a gain of zero. As a result, no signals from the associated memory 26 would reach the combiner 30, decoupling the memory 26 from the combiner 30.

The acquisition apparatus may include a controller 32. The controller may be configured to control the input switch 20 and the output switch 22 to select a desired path, and to control the signal selector 16 to select the frequency shifting signal 14. In addition, the controller 32 may control which memory 26 will store any signal from the digitizer 24. For example, the controller 32 may set the input switch 20 and the output switch 22 to the bypass path 10. Thus, the digitizer would receive an input signal through the bypass path 10. Similarly, the controller 32 may set the input switch 20 and the output switch 22 to the frequency shift path 12, and set the signal selector 16 to select a desired frequency shifting signal 14. As a result, the digitizer would receive an input signal frequency shifted by the frequency shift path 12.

Figure 2:
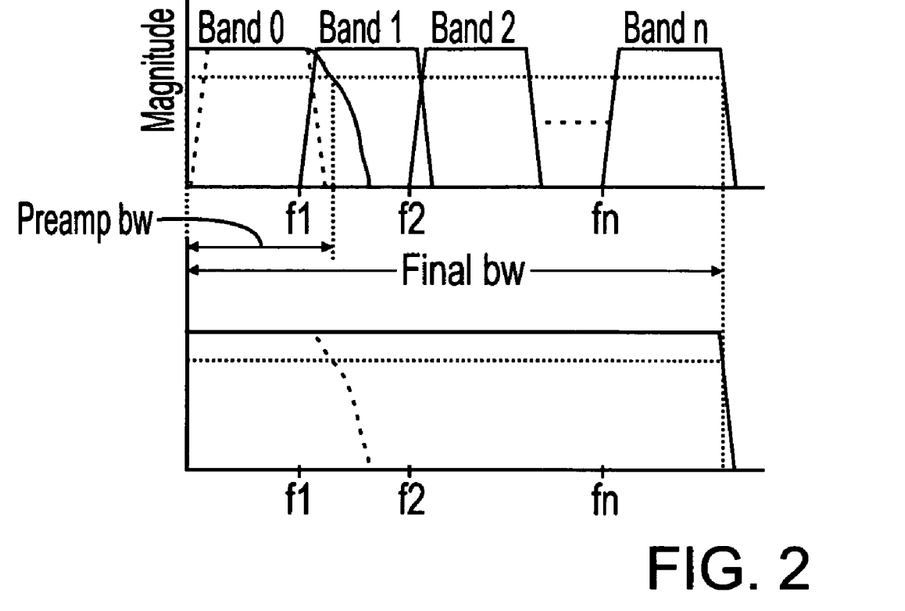
FIG. 2 is a chart showing an example of the frequency domain content of an input signal, frequency bands of the input signal, and a reconstructed signal bandwidth in the apparatus of FIG. 1.

FIG. 2 is a chart showing an example of the frequency domain content of an input signal, frequency bands of the input signal, and a reconstructed signal bandwidth in the apparatus of FIG. 1. Band0 shows approximately the input bandwidth of a digitizer 24. Since bands Band1 through Bandn are beyond the bandwidth of the digitizer 24, the digitizer would normally not be able to digitize the signals in those bands. By frequency shifting bands Band1 through Bandn to be within the bandwidth of the digitizer 24, the signals within those bands may be digitized. The Final BW shows the bandwidth of the reconstructed signal using bands Band0 through Bandn relative to the bandwidth of the digitizer 24.

Figure 3:
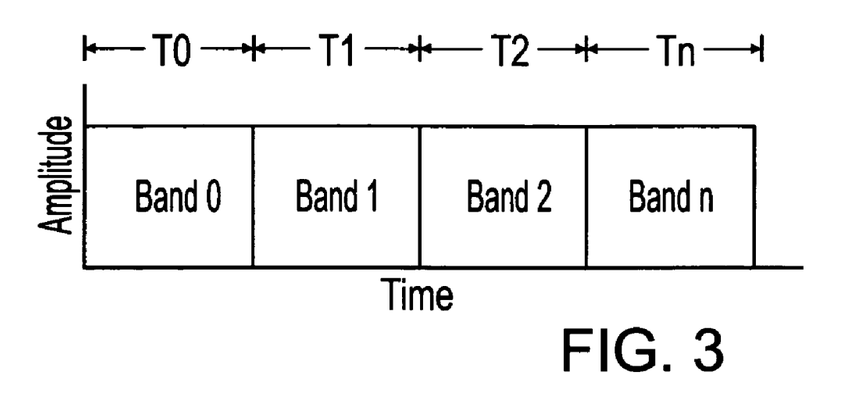
FIG. 3 is a chart showing an example of a signal at the input of a digitizer of FIG. 1 in the time domain.

FIG. 3 is a chart showing an example of a signal at the input of a digitizer in the time domain. As described above, the bands are not digitized simultaneously. In FIG. 3, Band0 is digitized over time period T0, Band1 is digitized over time period T1, Band2 is digitized over time period T2, and Bandn is digitized over time period Tn. After Bandn has been digitized, the input signal having a bandwidth covering bands Band0 through Bandn may be reconstructed. Thus, each band is digitized by the same digitizer during different time periods.

Although an acquisition apparatus has been described, such acquisition apparatus may be part of a test and measurement instrument. Such a test and measurement instrument may include an oscilloscope platform. The acquisition apparatus may be part of the oscilloscope itself, or may be part of a probe head or plug-in module for use with the oscilloscope. Alternatively, the acquisition apparatus may also be part of a digitizer platform with the primary goal of converting an analog waveform into a digital waveform stored as binary samples in memory.

An example of such a test and measurement instrument may include means for selecting a selected shift frequency from at least one shift frequency, means for shifting an input signal by the selected shift frequency, means for selecting the input signal or the frequency-shifted signal, means for digitizing the selected signal, means for storing the digitized version of each of the input signal and the signal frequency shifted by each shift frequency, and means for combining the stored signals into a reconstructed signal.

The means for selecting a selected shift frequency from at least one shift frequency may include a signal selector 16 as described above. However other means for selecting the selected shift frequency are possible. For example, such means may include a signal generator. A signal generator may be capable of generating multiple frequencies. Thus, there may only be one generator for all of the shift frequencies. To select a particular shift frequency, the signal generator may be programmed with the desired shift frequency. When a different shift frequency is needed, the signal generator may be programmed with the new shift frequency.

The means for shifting an input signal by the selected shift frequency may include the means for frequency shifting 48 as described above. Although only one frequency shift path 12 has been described above, the means for shifting the input signal may include multiple frequency shifting paths 12. Each frequency shifting path 12 may shift multiple bands of the input signal. The combination of the bypass path 10 and the multiple frequency shifting paths 12 may allow for digitization of the desired bands of the input signal. Multiple frequency shifting paths 12 may be useful if a frequency shifter 18 as part of a frequency shift path 12 can only cover a portion of the bands of the input signal. For example, if a mixer is used as a frequency shifter 18, the mixer may only have bandwidth covering 5 to 15 GHz. If the input signal has frequency bands beyond 15 GHz, then an additional mixer is needed to cover the higher frequency range. The additional mixer may cover frequencies from 15 to 25 GHz and be part of a second frequency shifting path.

The means for selecting the input signal or the frequency-shifted signal may include the input switch 20 and the output switch 22 as described above. However, such means may include only the output switch 22. For example, if the input signal is split between the bypass path 10 and the frequency shift path 12, only an output switch 22 may be needed. The bypass path 10 would pass the input signal at the same time as the input signal is frequency shifted. One of these signals may be selected with the output switch 22.

The means for digitizing the selected signal may include the digitizer 24 as described above. In addition, amplifiers, filters, attenuators, input limiters, etc. may be used with a digitizer 24.

The means for storing the digitized version of each of the input signal and the signal frequency shifted by each shift frequency may include the memories 26 as described above. In addition, such means may include a single memory with each digitized signal stored in a particular location in the memory. Furthermore, the means for storing may be a first-in first-out (FIFO) memory that stores the output of a continuously sampling digitizer. The FIFO memory may not have fixed memory locations for the digitized signals acquired over certain time periods. Rather, the time of the selection of a signal to be digitized by the means for selecting may delimit the location of that signal in memory.

The means for combining the stored signals into a reconstructed signal may be used with the interpolators 36, the digital frequency shifters 28, and the combiner 30. In addition, the means for combining may be supplemented by the equalizing filters 38 and band reject switches 42. Although the means for combining has been illustrated as combining signals from separate memories in FIG. 1, the means for combining may work in conjunction with the means for storing as described above. For example, the means for combining may access particular portions of a single memory depending on the way that the digitized signals are stored in the memory.

The acquisition apparatus may also include means for selecting a subset of the stored signals, in which case the means for combining operates to combine the subset of stored signals into the reconstructed signal. The means for selecting a subset of the stored signals may include the band reject switches 42 as described above. In addition, the means for selecting a subset may be coupled to other apparatuses that affect the contribution of a particular stored signal to the reconstructed signal. For example, the means for selecting a subset may include setting the values of the stored signal to zero to eliminate its contribution to the reconstructed signal.

The means for shifting the signal may also be coupled to means for filtering the signal. The means for filtering may have a different cutoff frequency for each shift frequency. During the frequency shifting of the signal, frequency components outside of the desired band of the input signal may interfere with the frequency shifting of that band. By filtering the signal, the effects of the out-of-band frequencies can be reduced. In addition, the desired cutoff frequency for the filter may be different for each shift frequency. As a result, the means for filtering may include a tunable filter that can be tuned to have the desired cutoff frequency associated with the shift frequency.

The operation of embodiments of a method of digitizing a signal using a sequential frequency band acquisition apparatus will now be described in reference to FIGS. 4-9.

Figure 4:
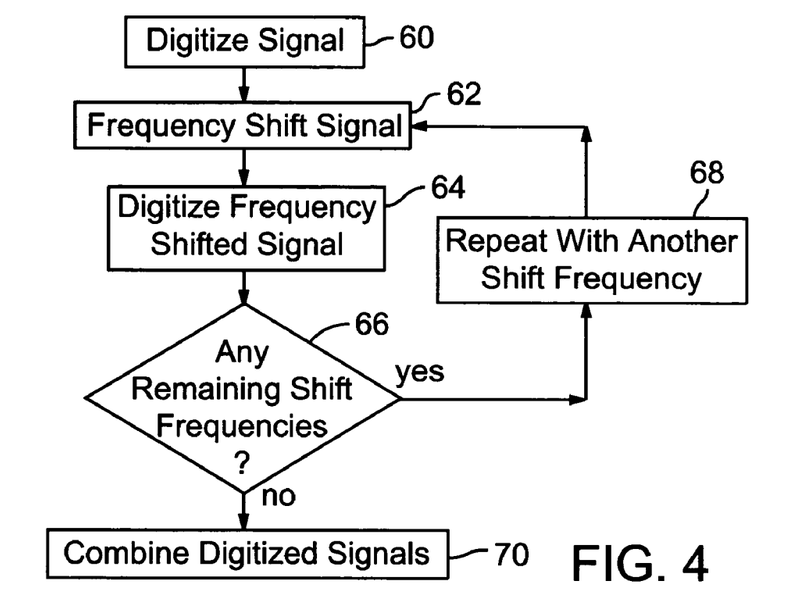
FIG. 4 is a flowchart of an example of a method of digitizing a signal using a sequential frequency band acquisition apparatus.

FIG. 4 is a flowchart of a method of digitizing a signal using a sequential frequency band acquisition apparatus. A signal is digitized in 60 during an unshifted time period using a digitizer. For example, in reference to FIG. 1, to digitize the signal, the input switch 20 and the output switch 22 are set to the bypass path 10. The digitizer 24 then digitizes the input signal passing through the bypass path 10. This digitized signal may be stored in a memory 26.

The input signal is frequency shifted in 62 by at least one shift frequency. For each shift frequency used, the frequency shifting occurs during an associated shifted time period. The associated shifted time period for any given shift frequency is different from any other shifted time period and the unshifted time period. As a result, the periods over which the input signal is frequency shifted by a given shift frequency are different from both one another and the time period during which an unshifted input signal is digitized.

Each frequency-shifted signal is digitized in 64. As described above, each frequency-shifted signal is frequency shifted during a shifted time period. During that shifted time period, that frequency-shifted signal is digitized. For example, in reference to FIG. 1, during a first shifted time period, the input switch 20 and the output switch 22 are set to the frequency shift path 12. The signal selector 16 selects a first shift frequency and the input signal is shifted by that frequency. The frequency-shifted signal is then digitized at the digitizer 24. During a second shifted time period, the frequency shifting and digitizing are repeated with another shift frequency. As a result, the unshifted input signal and the frequency-shifted signals are digitized by the same digitizer through time division multiplexing. To help synchronize the unshifted and frequency-shifted signals, each signal may be digitized in response to an external trigger associated with the input signal.

Although one order of digitizing the signals has been described, the order may be in any order desired. For example, a first frequency-shifted signal may be digitized. Then an unshifted signal may be digitized. Finally, a second frequency-shifted signal may be digitized. Any order of digitizing unshifted and frequency-shifted signals is possible.

The frequency shifting and digitizing may be repeated as desired for every frequency band of the input signal. Alternatively, only a subset of the frequency bands of the input signal may be frequency shifted and digitized, even though there is a capability of frequency shifting and digitizing all of the bands of the input signal. For example, consider an input signal with frequency bands of 0-5 GHz, 5-10 GHz, 10-15 GHz, and 15-20 GHz. To obtain a complete representation of any signal within the 0-20 GHz range, the 0-5 GHz band may be digitized unshifted, and the remaining three bands may be frequency shifted and digitized. Thus, the entire 0-20 GHz frequency range has been digitized. However, if one band, the 5-10 GHz band for example, is not desired, the 0-5 GHz band may be digitized unshifted, and only the 10-15 GHz and 15-20 GHz bands may be frequency shifted and digitized. As a result, frequency components of the input signal in the 5-10 GHz band will not be part of a reconstructed signal.

Any digitized signals are combined in 70. The digitized signals may include the unshifted digitized signal and the digitized frequency-shifted signals or a subset thereof. As described above, a frequency band that is available to be digitized need not be digitized. Thus, the unshifted frequency band need not be digitized and need not be used in the combination. The selected digitized signals are combined into a reconstructed signal. Because frequency components over a bandwidth larger than the bandwidth of a digitizer have been acquired, an input signal having a bandwidth greater that the digitizer may be accurately acquired.

Figure 5:
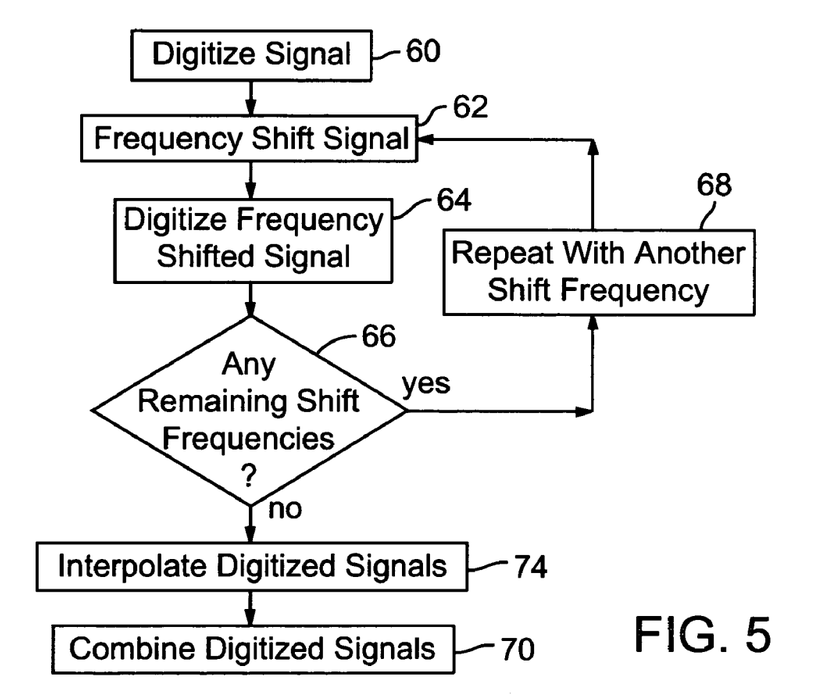
FIG. 5 is the flowchart of the operation of FIG. 4 further including interpolating of digitized signals.

FIG. 5 is the flowchart of the operation of FIG. 4 further including interpolating of digitized signals. In 74, digitized signals are interpolated. The digitized signals include any unshifted digitized signal and any digitized frequency-shifted signal. The digitized signals are interpolated to a higher common sample rate. In general, a sample rate of double the highest frequency component of a signal is adequate to accurately represent the signal digitally. Because the frequency-shifted signals are frequency shifted to be within the bandwidth of a digitizer, the sample rate of the digitizer may be sufficient to accurately represent the frequency-shifted signal. However, that sample rate may be lower than needed to accurately represent the frequency-shifted signal after is has been frequency shifted back to its original frequency range. As a result, the frequency-shifted signals are interpolated to a higher sample rate before frequency shifting the signals to their original frequencies. To aid in easier combination, the unshifted digitized signal can also be interpolated to the common sample rate. The interpolation provides a sufficient number of samples to adequately represent the original frequency components of the input signal. For example, if N consecutive bands of equal frequency width are acquired, then the sample rate of the digitized signals may be increased by a factor of N.

Figure 6:
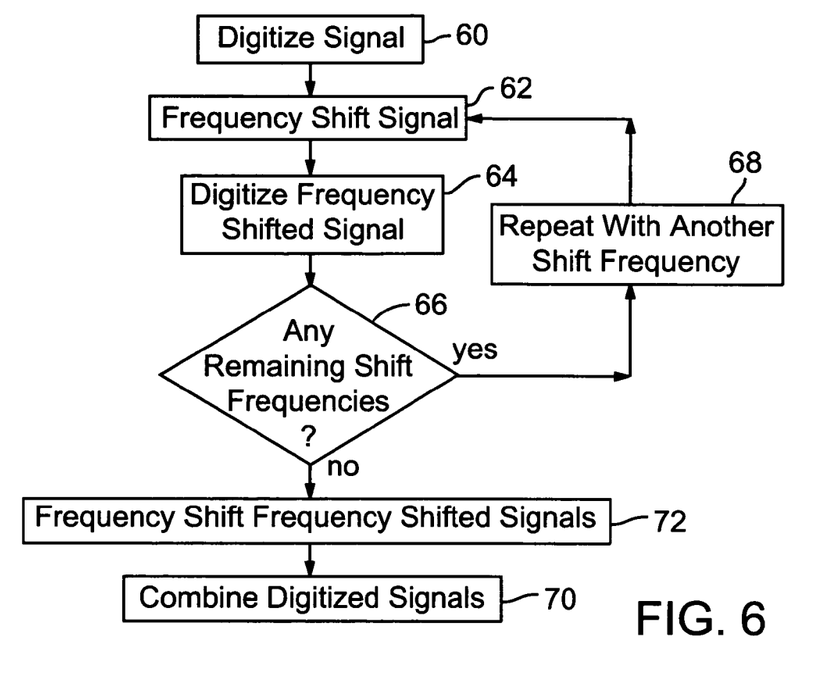
FIG. 6 is the flowchart of the operation of FIG. 4 further including frequency shifting of frequency-shifted signals.

FIG. 6 is the flowchart of the operation of FIG. 4 further including frequency shifting of frequency-shifted signals. In 72, any frequency-shifted signals are frequency shifted to their original frequencies. For example, a frequency range of 10-15 GHz may be frequency shifted to the 0-5 GHz range in 62, digitized in 64, then frequency shifted back to the 10-15 GHz range in 72.

Such frequency shifting may be performed by modulating the digitized signals. One method of modulation is to multiply the digitized signal by a sine wave of the same frequency as the original frequency shifting signal for that digitized signal. After such multiplication, a filter may be used to remove any unwanted products from the multiplication. Another method of modulation may include single sideband modulation of a sine wave. Single sideband modulation results in the input signal frequency shifted by the frequency of the sine wave.

Figure 7:
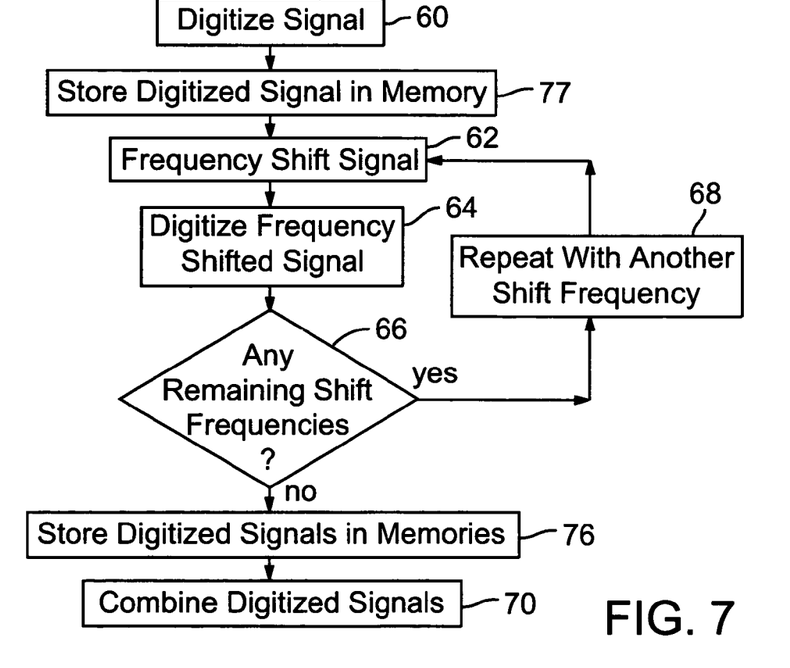
FIG. 7 is the flowchart of the operation of FIG. 4 further including storing digitized signals in memories.

FIG. 7 is the flowchart of the operation of FIG. 4 further including storing digitized signals in memories. In 77, the unshifted digitized signal is stored in a memory. In 76, each frequency-shifted digitized signal is stored in a memory. All of the digitized signals from the frequency bands of the signal are stored in respective memories. As a result, when the last desired frequency band is acquired, that frequency band may be combined with the digitized frequency bands digitized during earlier time periods. Although described as a separate memory for each digitized signal, one of ordinary skill in the art will understand that each memory may be part of the same memory, but occupy a different address space from the other memories.

Figure 8:
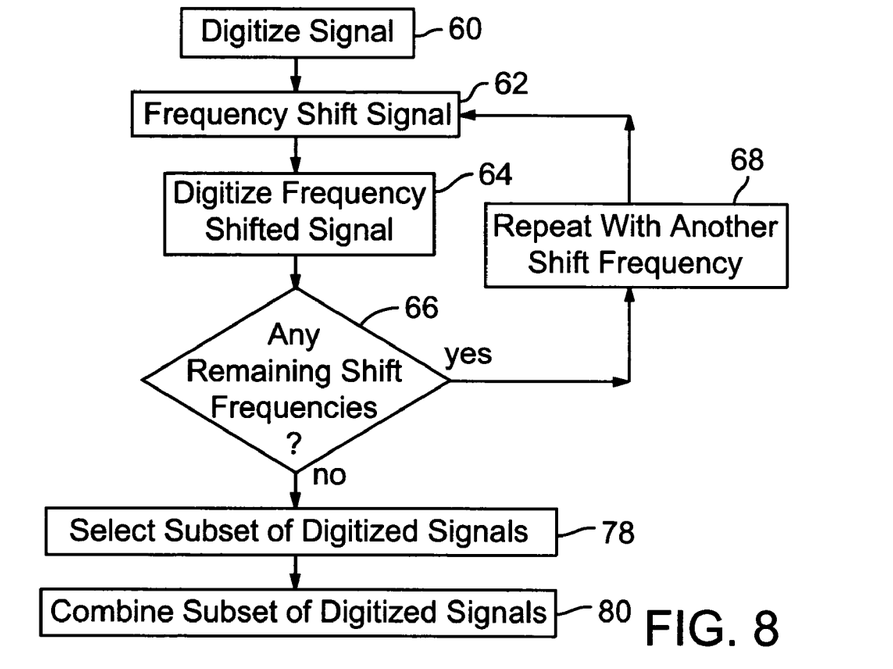
FIG. 8 is the flowchart of the operation of FIG. 4 further including selecting and combining selected digitized signals.

FIG. 8 is the flowchart of the operation of FIG. 4 further including selecting and combining selected digitized signals. In 78, a subset of the digitized signals is selected. In 80, that subset is combined into the reconstructed signal. Any subset of the digitized signals may be selected. For example, three of four digitized frequency bands may be selected. In addition, only one digitized signal may be selected.

Furthermore, the selection of a subset is distinct from the selection of the bands of signals to be digitized as described above in reference to the frequency shifting and digitizing. As described above, only desired bands may be frequency shifted and digitized, leaving out other possible bands of the input signal. Then all of the bands may be combined together. In contrast, when selecting a subset, the multiple bands are digitized, then a desired subset of the bands is selected to be combined. In the former example, only the desired bands are digitized. In the latter example, only the desired digitized signals of all of the digitized signals are combined. Thus, similar results may be achieved, through different methods.

Figure 9:
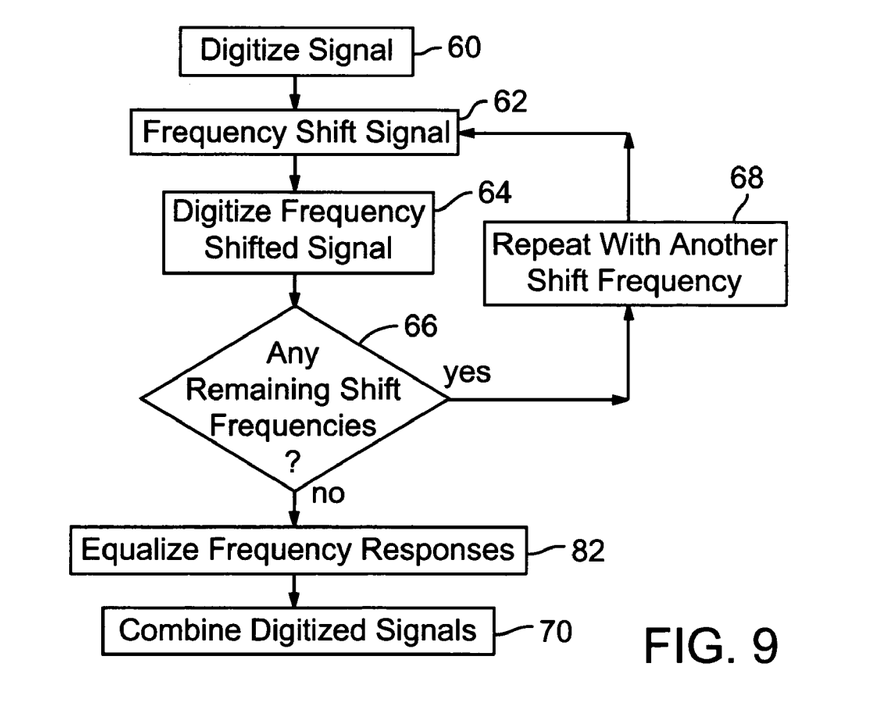
FIG. 9 is the flowchart of the operation of FIG. 4 further including equalizing frequency responses of paths of the signal.

FIG. 9 is the flowchart of the operation of FIG. 4 further including equalizing frequency responses of paths of the signal. In 82, the frequency response of the paths of the digitized signals may be equalized. The digitization, frequency shifting, and other processing of the signal may distort the signal. Each digitized signal may have different distortions. To compensate for this effect, the frequency responses affecting the digitized signals may be compensated. For example, the frequency shifting and digitizing may introduce magnitude and phase distortions, particularly in the frequency ranges close to the edges of frequency bands. Such distortions may be compensated for using an appropriate filter.

Although FIG. 9 illustrates the equalization 82 as occurring after acquiring the digitized signals, one of ordinary skill in the art will understand that the equalization 82 may be performed at any point while processing the input signal. For example, the equalization 82 may occur immediately prior to the combination of the digitized signals. In addition, the input signal may be pre-distorted, taking into account any non-linear effects such as any frequency shifting and distortion from any amplifications of the input signal. Furthermore, the equalization in 82 may be the result of partial equalization at multiple points in time with the aggregate forming the desired equalization.

Although shown separately in FIGS. 5-9, the additional procedures shown in those figures may be combined in various sub-combinations as a person of ordinary skill in the art deems useful to a particular application.

Although digital components and methods operating on digital signals have been described discretely, one of ordinary skill in the art will understand that such components and methods may be implemented discretely or in combination such as within a digital signal processing (DSP) integrated circuit.

Although particular embodiments have been described, it will be appreciated that the invention is not limited to those embodiments. Variations and modifications may be made without departing from the scope of the invention as described by the following claims.

The invention claimed is:

1. An acquisition apparatus for a test and measurement instrument comprising:
    an input to receive an input signal;
    a digitizer to digitize a selected signal;
    a bypass path to selectively couple the input to the digitizer;
    a frequency shift path to frequency shift the input signal and selectively couple the frequency-shifted input signal to the digitizer, the frequency shift path including a means for frequency shifting;
    an input switch to switch the input signal to one of the bypass path and the frequency shift path; and
    an output switch to provide the selected signal to the digitizer by selectively coupling an output of one of the frequency shift path and the bypass path to the digitizer.

2. The apparatus of claim 1, wherein the means for frequency shifting further comprises:
    at least one frequency shifting signal;
    a signal selector to select one of the at least one frequency shifting signal; and
    a frequency shifter to frequency shift the signal in response to the selected frequency shifting signal.

3. The apparatus of claim 2, wherein the frequency shifter further comprises a mixer.

4. The apparatus of claim 2, wherein the frequency shifting path further comprises a filter having a plurality of selectable cutoff frequencies.

5. The apparatus of claim 1, further comprising:
    a plurality of memories to store digitized signals from the frequency shift path for each selected frequency shifting signal, and from the bypass path;
    at least one digital frequency shifter to frequency shift an associated signal from the frequency-shifted path in an associated memory; and
    a combiner to combine the at least one digitally frequency-shifted signal and the signal from the bypass path.

6. The apparatus of claim 5, further comprising a plurality of interpolators, each interpolator configured to interpolate the signals in the memories to a common sample rate.

7. The apparatus of claim 5, further comprising an equalizing filter to equalize frequency responses from an input of the input switch, through the frequency shift path to an input of the equalizing filter for each frequency shifting signal.

8. The apparatus of claim 5, further comprising an equalizing filter to equalize a frequency response from an input of the input switch, through the bypass path, to an input of the equalizing filter.

9. The apparatus of claim 5, further comprising a plurality of band reject switches, each band reject switch operable to decouple an associated memory from a path to the combiner.

10. The apparatus of claim 1, further comprising a controller configured to control the input switch and the output switch to select a desired path, and to control the signal selector to select the frequency shifting signal.

11. The apparatus of claim 10, further comprising a plurality of memories to store digitized signals from the frequency shift path for each selected frequency shifting signal, and from the bypass path, wherein the controller being further configured to control storage of the digitized signals in each of the memories.

* * * * *